(12) United States Patent
Takakuwa

(10) Patent No.: US 11,152,218 B2
(45) Date of Patent: Oct. 19, 2021

(54) TEMPLATE, IMPRINT APPARATUS, IMPRINT METHOD AND IMPRINT APPARATUS MANAGEMENT METHOD

(71) Applicant: Toshiba Memory Corporation, Minato-ku (JP)

(72) Inventor: Manabu Takakuwa, Tsu (JP)

(73) Assignee: Toshiba Memory Corporation, Minato-ku (JP)

(\*) Notice: Subject to any disclaimer, the term of this patent is extended or adjusted under 35 U.S.C. 154(b) by 259 days.

(21) Appl. No.: 16/265,561

(22) Filed: Feb. 1, 2019

(65) Prior Publication Data

US 2019/0164770 A1 May 30, 2019

Related U.S. Application Data

(62) Division of application No. 14/927,833, filed on Oct. 30, 2015, now abandoned.

(30) Foreign Application Priority Data

Aug. 3, 2015 (JP) .................................. 2015-153512

(51) Int. Cl.
*H01L 21/3105* (2006.01)
*G03F 7/00* (2006.01)
*G03F 9/00* (2006.01)

(52) U.S. Cl.
CPC ........ *H01L 21/3105* (2013.01); *G03F 7/0002* (2013.01); *G03F 9/7038* (2013.01)

(58) Field of Classification Search
CPC ... H01L 21/3105; G03F 7/0002; G03F 9/7038
See application file for complete search history.

(56) References Cited

U.S. PATENT DOCUMENTS

| | | | |
|---|---|---|---|
| 6,972,844 B2 | 12/2005 | Tokita |
| 7,678,513 B2 | 3/2010 | Nomura |
| 8,377,349 B2 | 2/2013 | Sato |
| 8,703,035 B2 | 4/2014 | Sato |
| 8,842,294 B2 | 9/2014 | Minoda et al. |
| 9,283,720 B2 | 3/2016 | Minoda et al. |

(Continued)

FOREIGN PATENT DOCUMENTS

| | | |
|---|---|---|
| JP | 2005-101313 | 4/2005 |
| JP | 2006-39148 | 2/2006 |

(Continued)

*Primary Examiner* — Robert J Grun
(74) *Attorney, Agent, or Firm* — Oblon, McClelland, Maier & Neustadt, L.L.P.

(57) ABSTRACT

According to the embodiments, a template in which a main pattern is placed on a pattern-formed surface of a template substrate, the main pattern being formed by a concave and convex pattern, the template substrate being transparent to an electromagnetic wave with a predetermined wavelength is provided. The template includes a first mark in which line-shaped first concave patterns and first convex patterns are alternately placed in a width direction on the pattern-formed surface. The first convex pattern includes a first light-blocking portion and a first translucent portion. The first light-blocking portion is a region including a first side surface in the width direction and being covered with a metal film. The first translucent portion is a region including a second side surface in the width direction and being not covered with the metal film.

12 Claims, 15 Drawing Sheets

(56) References Cited

U.S. PATENT DOCUMENTS

| | | |
|---|---|---|
| 2011/0024930 A1 | 2/2011 | Sato |
| 2012/0328725 A1 | 12/2012 | Minoda et al. |
| 2013/0187312 A1 | 7/2013 | Pauliac et al. |
| 2014/0346694 A1 | 11/2014 | Minoda et al. |

FOREIGN PATENT DOCUMENTS

| | | |
|---|---|---|
| JP | 4478424 | 6/2010 |
| JP | 2011-29538 A | 2/2011 |
| JP | 2011-243664 | 12/2011 |
| JP | 2012-124390 | 6/2012 |
| JP | 2013-30757 A | 2/2013 |
| JP | 2013-219230 A | 10/2013 |

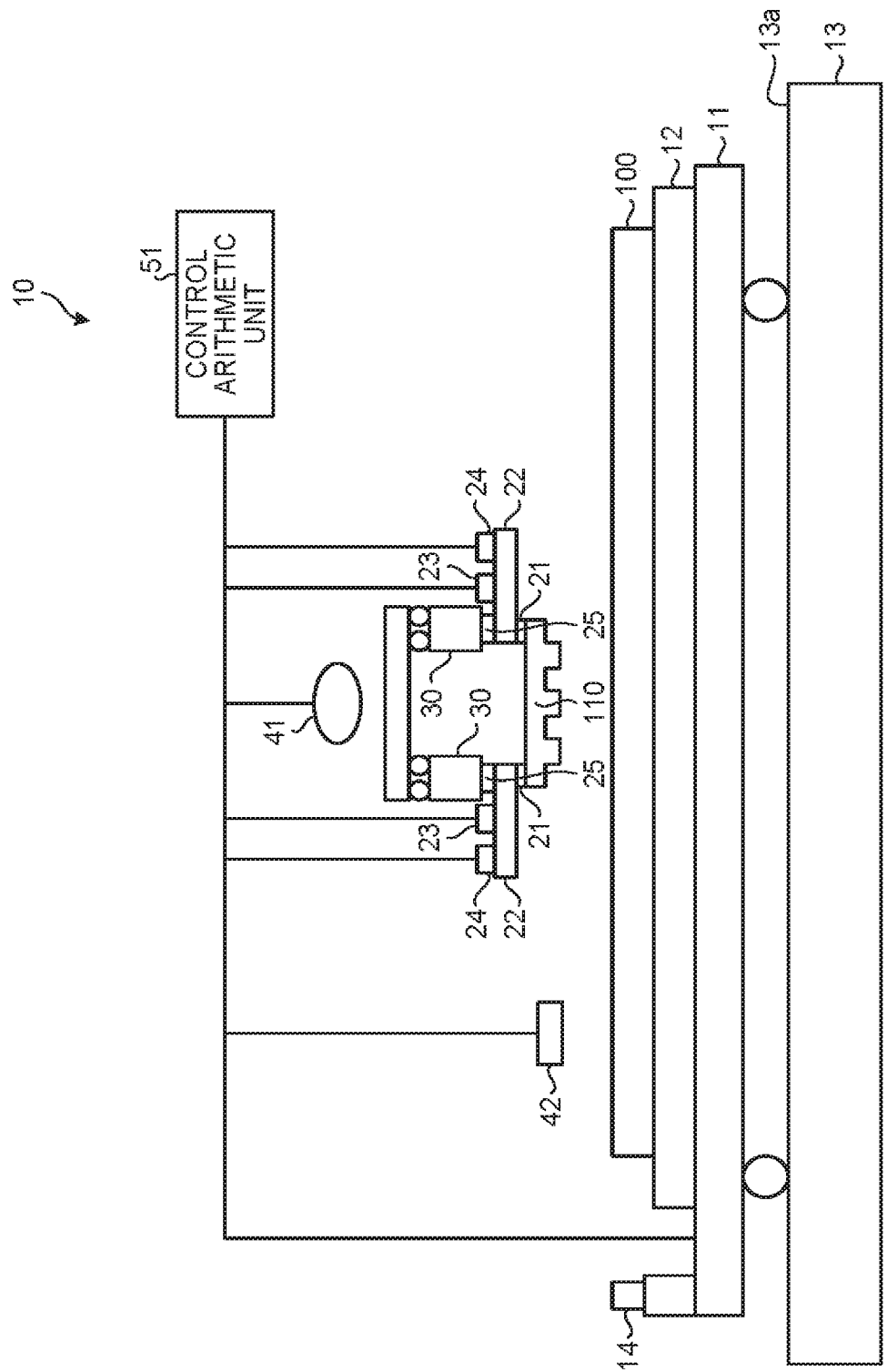

FIG.5A
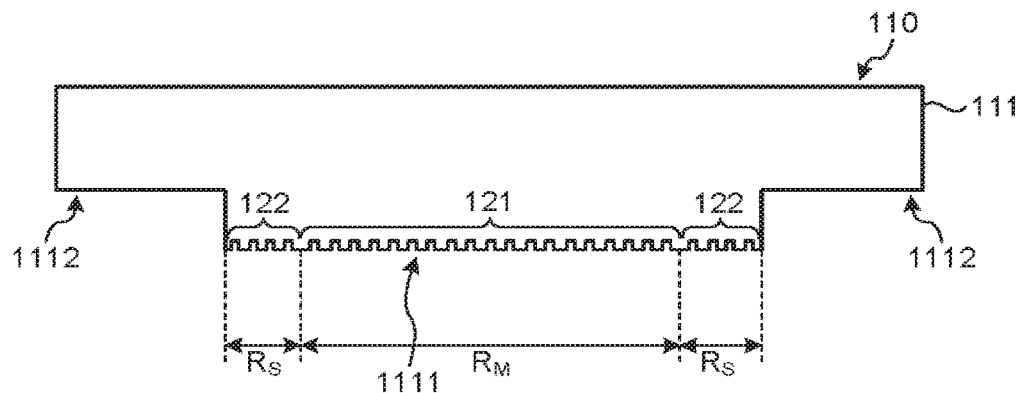
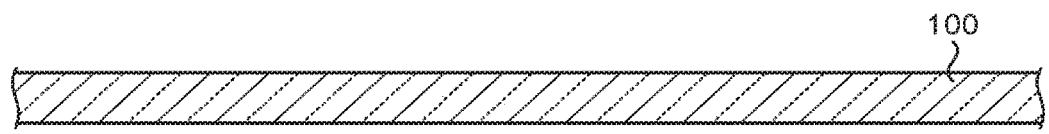
FIG.5B
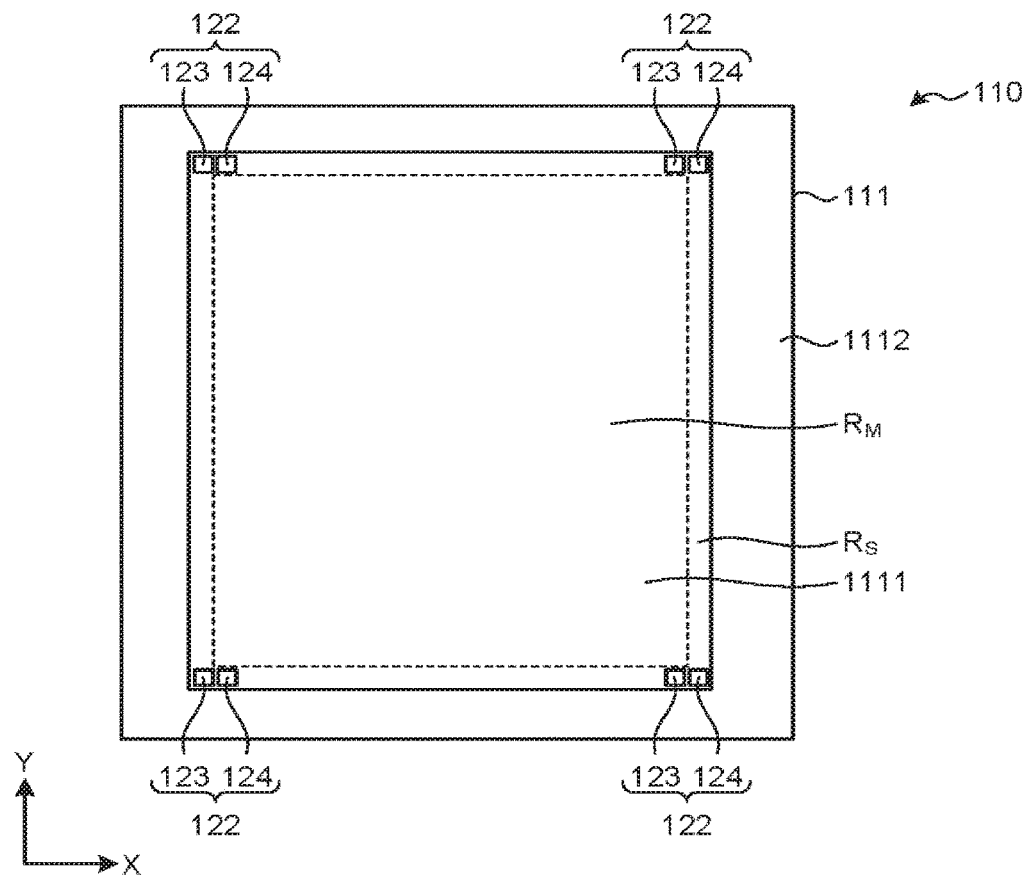

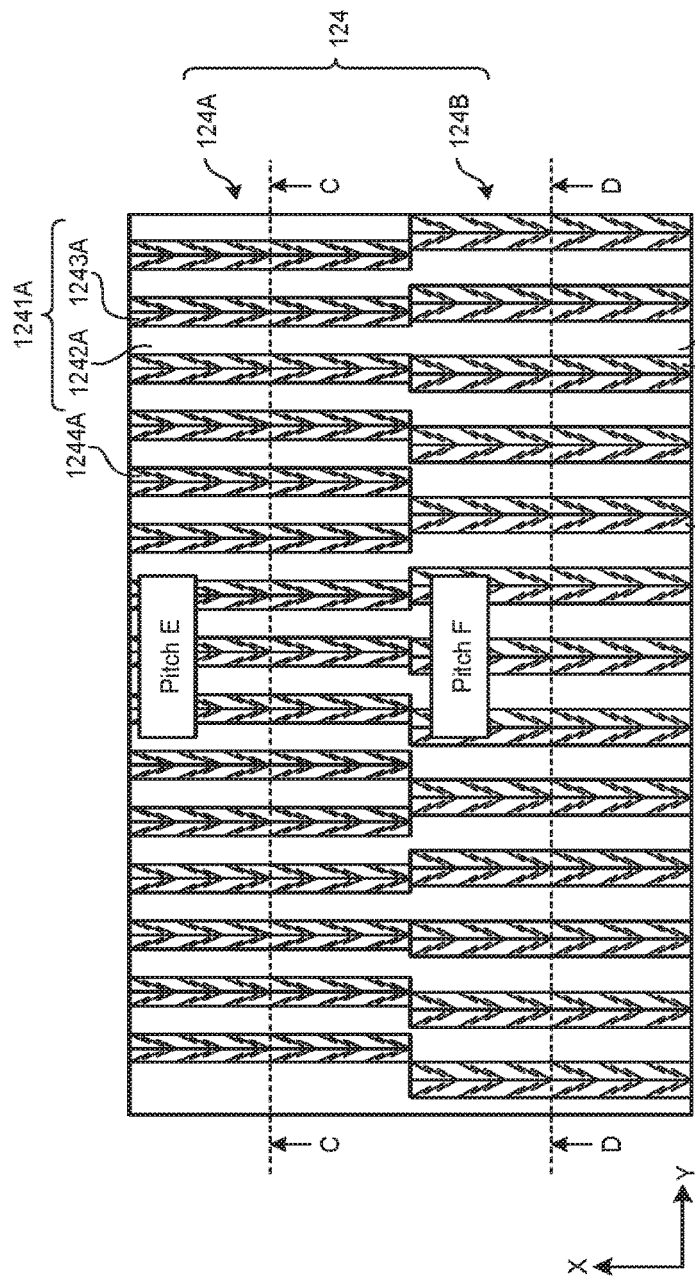
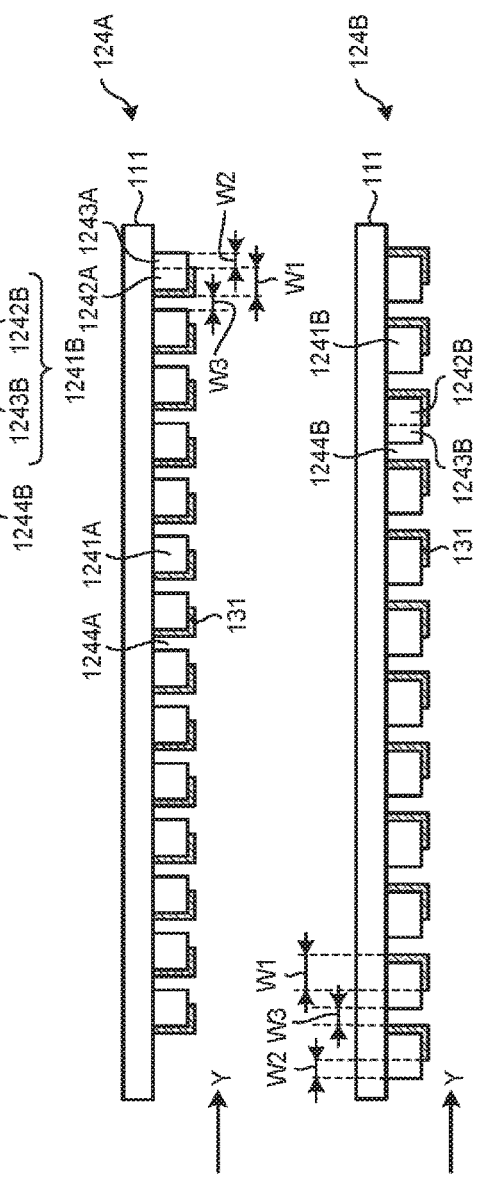
FIG.9A
FIG.9B
FIG.9C

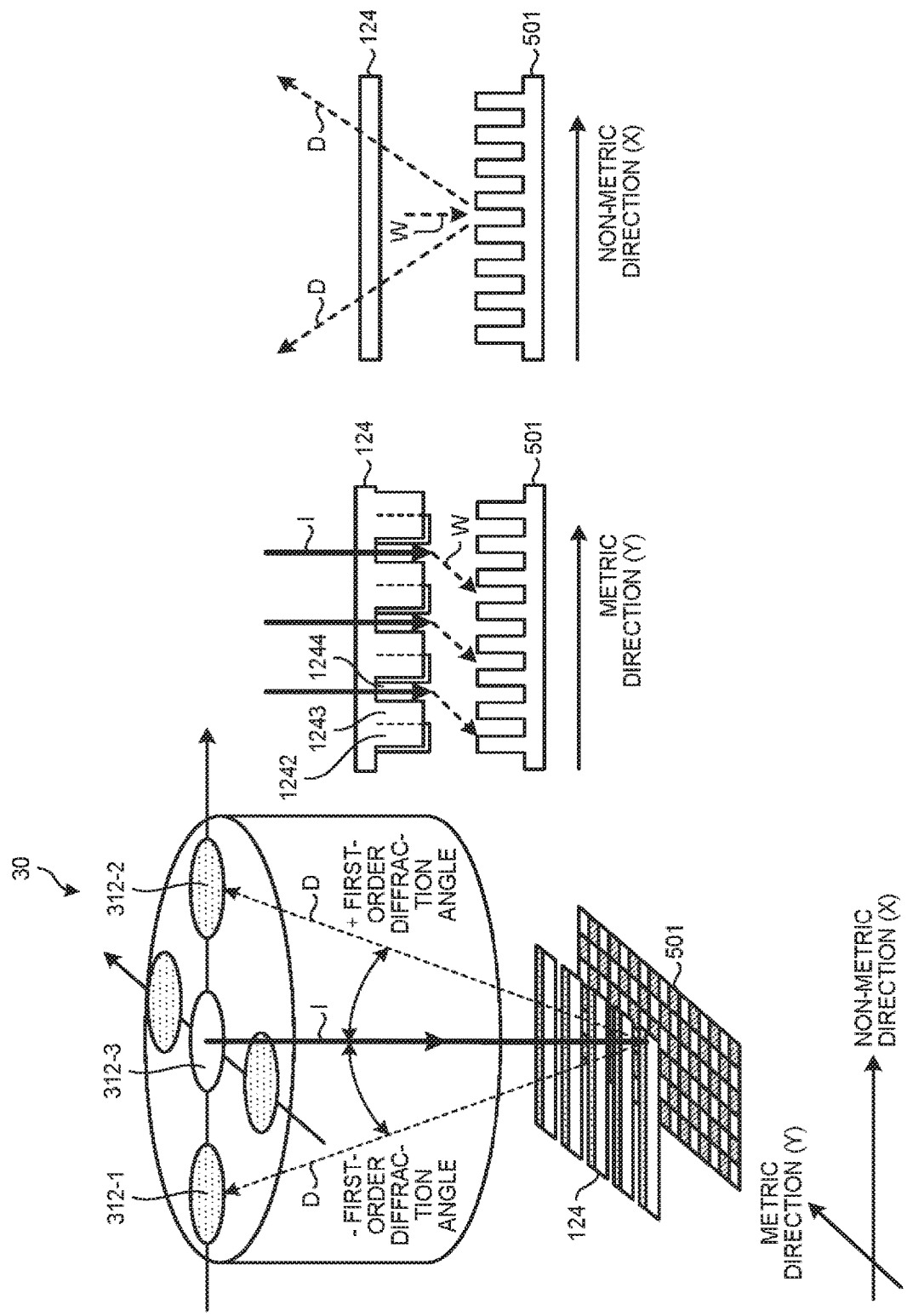

TEMPLATE, IMPRINT APPARATUS, IMPRINT METHOD AND IMPRINT APPARATUS MANAGEMENT METHOD

CROSS-REFERENCE TO RELATED APPLICATIONS

This is a divisional of U.S. application Ser. No. 14/927,833, filed on Oct. 30, 2015, which is based upon and claims the benefit of priority from Japanese Application No. 2015-153512, filed on Aug. 3, 2015; the entire contents of which are incorporated herein by reference.

FIELD

Embodiments described herein relate generally to an template, an imprint apparatus, an imprint method and an imprint apparatus management method.

BACKGROUND

In an imprint apparatus, a wafer to be processed is hold with a vacuum chuck provided on a substrate stage. A template on which a pattern is formed is pressed against the wafer through a resist. The resist is cured and then the template is removed from the resist.

The template is created normally by transferring the pattern of a master template to a template substrate. However, the magnification of the pattern transferred from the master template varies depending on the degree of flatness of the reverse surface of the template substrate. The variations in magnification of the pattern become more pronounced as the pattern is shrunk. A technique to measure the misalignment between the template and the wafer has been proposed. However, a technique to measure the degree of flatness of the surface of the template has not been proposed.

BRIEF DESCRIPTION OF THE DRAWINGS

FIG. 1 is a schematic cross-sectional view of an exemplary configuration of an imprint apparatus according to a first embodiment;

FIGS. 5A and 5B are schematic views of an exemplary configuration of a template;

FIGS. 9A to 9C are views of an exemplary height-measuring alignment mark provided on the template;

FIGS. 10A to 10C are schematic views of a method for measuring the distance between the template and the to-be-processed layer;

DETAILED DESCRIPTION

Figure 2A:
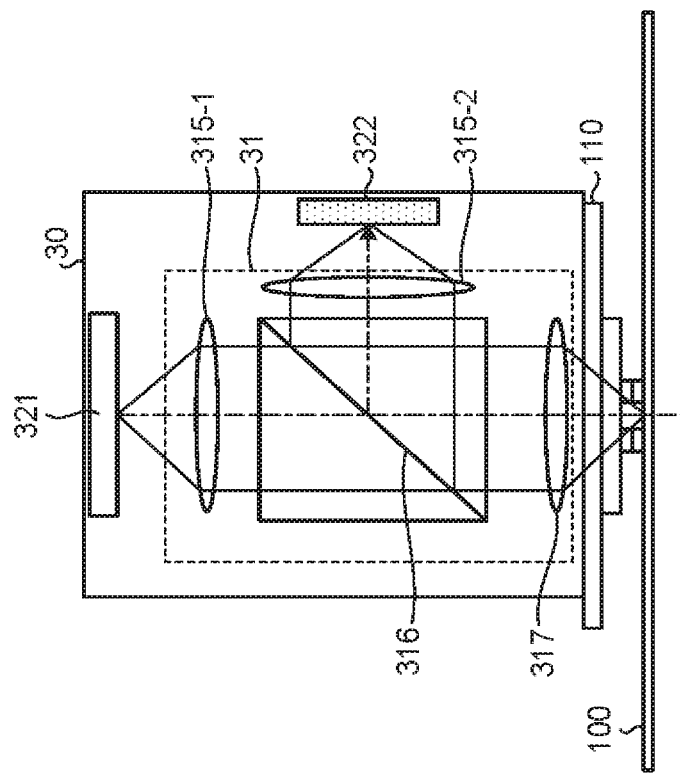
FIGS. 2A and 2B are schematic cross-sectional views of other exemplary configurations of the alignment scope according to the first embodiment.

According to the embodiments, a template in which a main pattern is placed on a pattern-formed surface of a template substrate, the main pattern being formed by a concave and convex pattern, the template substrate being transparent to an electromagnetic wave with a predetermined wavelength is provided. The template includes a first mark in which line-shaped first concave patterns and first convex patterns are alternately placed in a width direction on the pattern-formed surface. The first convex pattern includes a first light-blocking portion and a first translucent portion. The first light-blocking portion is a region including a first side surface in the width direction and being covered with a metal film. The first translucent portion is a region including a second side surface in the width direction and being not covered with the metal film.

The template, imprint apparatus, imprint method and imprint apparatus management method according to the embodiments will be described in detail hereinafter with reference to the appended drawings. Note that the present invention is not limited to the embodiments.

First Embodiment

FIG. 1 is a schematic cross-sectional view of an exemplary configuration of an imprint apparatus according to the first embodiment. An imprint apparatus 10 includes a substrate stage 11. The substrate stage 11 is provided with a chuck 12. The chuck 12 holds a pattern-transferred substrate 100 on which a pattern is to be formed. The chuck 12 holds the pattern-transferred substrate 100, for example, by vacuum contact.

The pattern-transferred substrate 100 includes a substrate such as a semiconductor substrate, a underlaying pattern formed on the substrate, and a to-be-processed layer formed on the underlaying pattern. When a pattern is transferred, the pattern-transferred substrate 100 further includes a resist (an imprint agent) formed on the to-be-processed layer. The to-be-processed layer can be, for example, an insulating film, a metal film (conductive film), or a semiconductor film.

The substrate stage 11 is movably provided on a stage surface plate 13. The substrate stage 11 is provided movably along each of two axes along an upper surface 13a of the stage surface plate 13. In this embodiment, the two axes along the upper surface 13a of the stage surface plate 13 are an X axis and a Y axis. The substrate stage 11 is movable also along a Z axis in a direction of height perpendicular to the X axis and the Y axis. The substrate stage 11 is preferably rotatable around each of the X axis, the Y axis, and the Z axis.

The substrate stage 11 is provided with a reference mark stand 14. The reference mark (not illustrated) that is the reference position for the imprint apparatus 10 is placed on the reference mark stand 14. The reference mark is formed, for example, by diffraction gratings in a checker pattern. The reference mark is used to calibrate alignment scopes 30, and determine the position of a template 110 (posture control and adjustment) The reference mark is the origin on the substrate stage 11. The coordinates X and Y of the pattern-transferred substrate 100 set on the substrate stage 11 are coordinates with respect to the reference mark stand 14 as the origin.

The imprint apparatus 10 includes a template stage 21. The template stage 21 fixes the template (original plate or mold) 110. The template stage 21 holds, for example, the edges of the template 110 by vacuum contact. The template stage 21 operates so as to position the template 110 at the apparatus basis. The template stage 21 is attached to the base portion 22.

Correction mechanisms 23 and pressurization portions 24 are attached to the base portion 22. The correction mechanisms 23 include, for example, adjustment mechanisms that receive an instruction from the control arithmetic unit 51, and finely adjust the position (posture) of the template 110. This adjustment corrects the positions of the template 110 and the pattern-transferred substrate 100 in relation to each other.

The pressurization portions 24 correct the distortion of the template 110 by giving a stress to the side surface of the template 110. The pressurization portions 24 pressurize the template 110 in the direction from the four side surfaces to the center of the template 110. This pressurization corrects the size of the pattern to be transferred (magnification correction). The pressurization portions 24, for example, receive an instruction from the control arithmetic unit 51, and pressurize the template 110 at a predetermined stress.

The base portion 22 is attached to an alignment stage 25. The alignment stage 25 moves the base portion 22 in the X axis and Y axis directions in order to align the template 110 and the pattern-transferred substrate 100. The alignment stage 25 has also a function to rotate the base portion 22 along the XY plane. The rotational direction along the XY plane is a θ direction.

The alignment scopes 30 detect an alignment mark provided on the template 110 and an alignment mark provided on the pattern-transferred substrate 100. The alignment mark of the template 110 and the alignment mark of the pattern-transferred substrate 100 are used to measure the relative misalignment between the template 110 and the pattern-transferred substrate 100. The alignment mark of the template 110 and the alignment mark of the pattern-transferred substrate 100 will be described below. Note that, although FIG. 1 illustrates only two right and left alignment scopes 30, the number of alignment scopes 30 is preferably four or more.

Figure 2B:
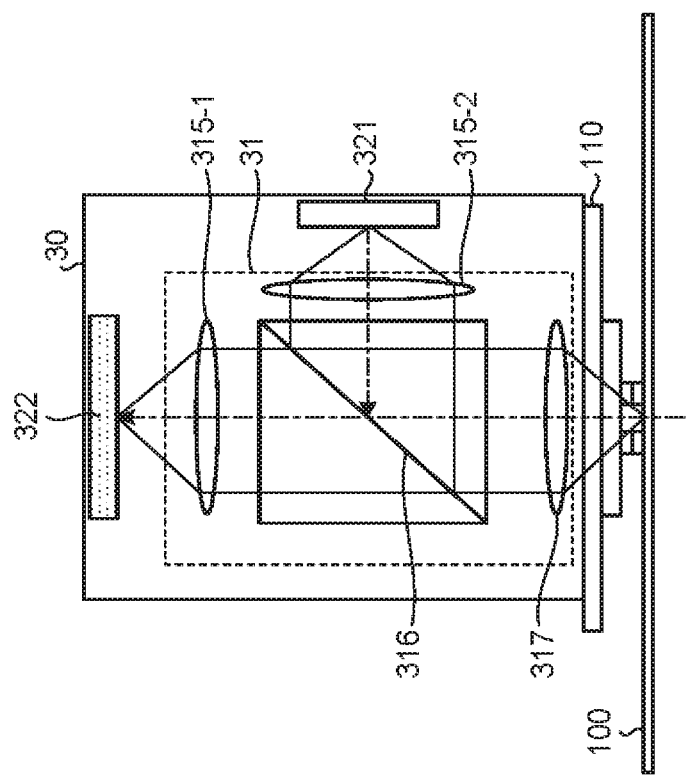

FIGS. 2A and 2B are schematic cross-sectional views of other exemplary configurations of the alignment scope according to the first embodiment. FIG. 2A illustrates an exemplary configuration to correct the misalignment, and FIG. 2B illustrates an exemplary configuration to measure the height.

The alignment scope 30 includes a projection optical system 31. The projection optical system 31 includes lenses 315-1, 315-2, and 317 at the upper part, the lower part placed on the template 110 side, and a side surface in a direction perpendicular to a vertical direction, respectively. The projection optical system 31 includes a half mirror 316 among the lenses 315-1, 315-2, and 317.

The alignment scope 30 further includes a light source 321 and a light reception sensor 322. To correct the misalignment, the light source 321 is placed on the side surface side of the projection optical system 31, and the light reception sensor 322 is placed on the upper surface side as illustrated in FIG. 2A. In the correction, the half mirror 316 reflects the light from the light source 321 to the lens 317 at the lower part side, and transmits the diffracted light entering from the lens 317 at the lower part side to the upper surface side.

To measure the height, the light source 321 is placed at the upper part side of the projection optical system 31 and the light reception sensor 322 is placed on the side surface side as illustrated in FIG. 2B. In the measurement, the half mirror 316 transmits the light from the light source 321 to the lens 317 at the lower part side, and reflects the diffracted light entering from the lens 317 at the lower part side to the lens 315-2.

Note that, although not illustrated, a lens or mirror can be placed between the lens 315-1 at the upper part side and the half mirror 316, or between the lens 317 at the lower part side and the half mirror 316. For example, a lens or mirror is placed between the lens 317 at the lower part side and the half mirror 316 such that the incident light from the lens 315-2 on the side surface side enters the template 110 at a first-order diffraction angle, or such that the ±first-order diffracted light diffracted at the aligned alignment marks is led to the lens 315-2 on the side surface side.

Figure 3A:
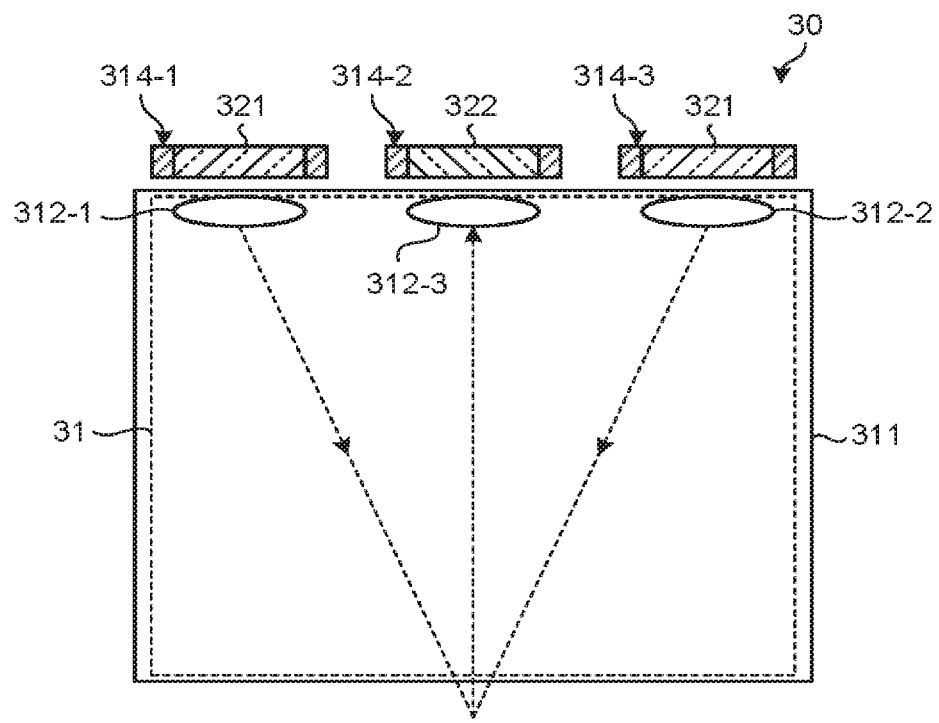
FIGS. 3A and 3B are schematic enlarged views of the vicinity of the lenses on the lower surface of the alignment scope according to the embodiments.
Figure 3B:
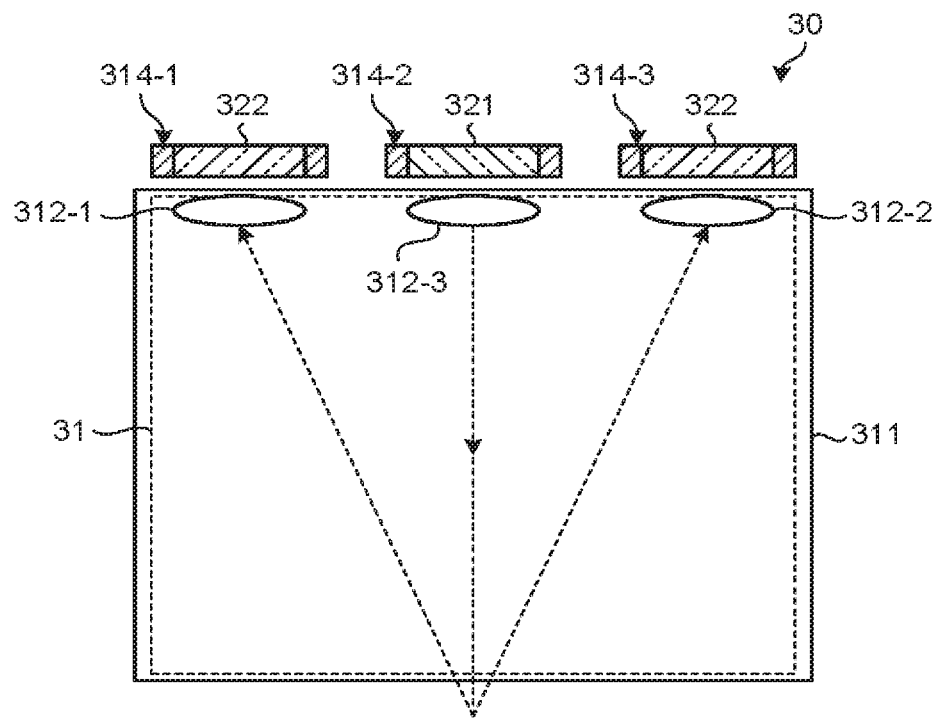

FIGS. 3A and 3B are schematic enlarged views of the vicinity of the lenses on the lower surface of the alignment scope according to the embodiments. FIG. 3A illustrates an exemplary configuration when correcting the misalignment, and FIG. 3B illustrates an exemplary configuration when measuring the height.

The alignment scope 30 includes a housing 311 including a projection optical system 31. The alignment scope 30 is placed such that the lower surface of the housing 311 faces the template 110. Although not illustrated, the projection optical system 31 includes a lens or mirror that leads the incident light and the diffracted light. The first to third light input and output units 312-1 to 312-3 working as lenses are provided at the lower part side of the housing 311. The enlarged lens 317 in FIGS. 2A and 2B is the first to third light input and output units 312-1 to 312-3. A predetermined distance is placed between the first light input and output unit 312-1 and the second light input and output unit 312-2 in a non-metric direction. The third light input and output unit 312-3 is placed at the midpoint between the first light input and output unit 312-1 and the second light input and output unit 312-2. In this example, the non-metric direction is a direction in which the line patterns forming the alignment mark of the template 110 extend.

Note that fourth and fifth light input and output units (not illustrated) can be provided in a metric direction such that the third light input and output unit 312-3 is placed at the midpoint. In this example, the metric direction is a direction perpendicular to the non-metric direction. The distance placed between the fourth and fifth light input and output units is identical to the distance between the first light input and output unit 312-1 and the second light input and output unit 312-2. The configuration described above enables the correction of the misalignment or the measurement of the height without rotating the alignment scope 30 when the metric direction is either of the X direction and the Y direction.

Figure 4:
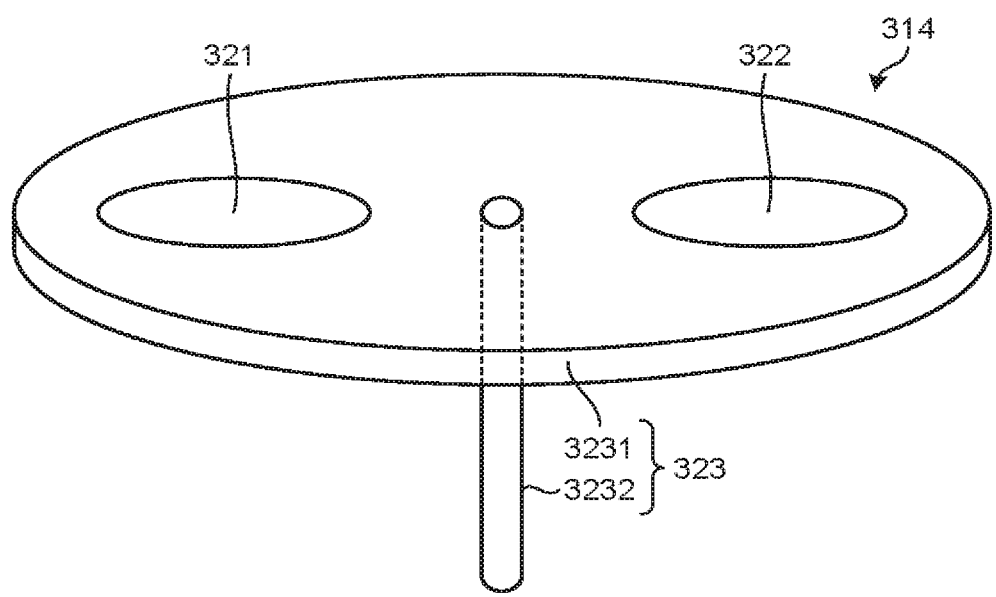
FIG. 4 is a schematic perspective view of an exemplary configuration of a light source/light reception sensor switching unit.

In the alignment scope 30, first to third light source/light reception sensor switching units 314-1 to 314-3 are provided on the light paths formed by the first to third light input and output units 312-1 to 312-3, respectively. FIG. 4 is a schematic perspective view of an exemplary configuration of the light source/light reception sensor switching unit. The light source/light reception sensor switching unit 314 includes a light source 321, a light reception sensor 322, and a switching unit 323. The light source 321 emits a light with a predetermined wavelength. For example, a laser diode or a Light Emitting Diode (LED) can be used as the light source 321.

The light reception sensor 322 measures the intensity of the diffracted light from the alignment mark. For example, a diode can be used as the light reception sensor 322. The switching unit 323 switches the object to be placed near the lens of the projection optical system 31 between the light source 321 and the light reception sensor 322 in accordance with the instruction from the control arithmetic unit 51. In the example of FIG. 4, the switching unit 323 is formed by a disk-shaped holding member 3231 and a supporting member 3232 that rotatably supports the vicinity of the center of the holding member 3231. The holding member 3231 holds the light source 321 and the light reception sensor 322. When the switching unit 323 receives an instruction for a switch, the holding member 3231 rotates such that the light source 321 or the light reception sensor 322 is placed adjacent to the lens. Note that the switch between the light source 321 and the light reception sensor 322 is preferably performed while the substrate stage 11 is stationary.

For example, in a case when correcting the misalignment, the light sources 321 are placed on the light paths formed by the first and second light input and output units 312-1 and 312-2, and the light reception sensor 322 is placed on the light path formed by the third light input and output unit 312-3 as illustrated in FIG. 3A. Alternatively, in a case when measuring the height, the light reception sensors 322 are placed on the light paths formed by the first and second light input and output units 312-1 and 312-2, and the light source 321 is placed on the light path formed by the third light input and output unit 312-3 as illustrated in FIG. 3B.

The first to third light input and output units 312-1 to 312-3 are placed such that the first-order diffracted light diffracted at the aligned alignment marks enters the third light input and output unit 312-3 in the configuration illustrated in FIG. 3A, and such that the first-order diffracted light diffracted at the aligned alignment marks enters the first and second light input and output units 312-1 and 312-2 in the configuration illustrated in FIG. 3B. The third to fifth input and output units are placed in the same manners. As described above, a reflective mirror and optical system (not illustrated) are arranged in the alignment scope 30 such that the directions in which incident light and the diffracted light travel when the misalignment is corrected are opposite to the directions when the height is measured. In the examples of FIGS. 3A and 3B, the projection optical system 31 is used both to correct the misalignment and to measure the height.

The alignment scopes 30 detect the misalignment of the template 110 from the reference mark on the reference mark stand 14, and the misalignment of the pattern-transferred substrate 100 from the template 110 as described above. The positions (for example, the X and Y coordinates) of the alignment marks detected with the alignment scopes 30 are transmitted to the control arithmetic unit 51.

The alignment scope 30 according to the present embodiment further detects the degree of flatness of the pattern-formed surface of the template 110 held on the template stage 21 with a chuck. The degree of flatness of the template 110 is the information obtained, for example, by measuring the position of the pattern-formed surface in the Z direction (the height direction) from the principal surface facing the template stage 21 side (hereinafter, referred to also as a template height) at a plurality of places in the pattern-formed surface of the template 110. The template heights (for example, a Z coordinate), which are detected at the alignment marks of the template 110 by the alignment scope 30, are transmitted to the control arithmetic unit 51.

The imprint apparatus 10 includes a light source 41 and an application unit 42. The light source 41 emits, for example, an electromagnetic wave in the ultraviolet band. The light source 41 is placed, for example, immediately above the template 110. In another case, the light source 41 is not placed immediately above the template 110. In such a case, the light path is set with an optical member such as a mirror such that the template 110 is irradiated with the light, which is emitted from the light source 41, from immediately above the template 110.

The application unit 42 is a member that applies a resist on the pattern-transferred substrate 100. For example, the application unit 42 includes a nozzle to drop the resist on the pattern-transferred substrate 100 from the nozzle.

The imprint apparatus 10 includes a control arithmetic unit 51. The control arithmetic unit 51 entirely controls the imprint apparatus 10. The control arithmetic unit 51 performs, for example, a process for controlling the substrate stage 11, a process for controlling the light source 41, a process for correcting the misalignment, a process for calculating the template height, and a process for correcting the magnification in accordance with the program in which the contents of the respective processes are described.

The process for controlling the substrate stage 11 is a process for generating signals to control the substrate stage 11 in the X axis direction, the Y axis direction, the Z axis direction, and the θ direction. This controls the positions of the template 110 and the substrate stage 11 in relation to each other. The process for controlling the light source 41 is a process for controlling the time to irradiate the resist with the light by the light source 41 or the amount of the light with which the resist is irradiated when the resist is cured.

The process for correcting the misalignment is a process in which the misalignment of the template 110 from the reference mark is calculated with the alignment mark of the template 110 and the reference mark of the reference mark stand 14, and the misalignment of the pattern-transferred substrate 100 from the template 110 is calculated with the alignment mark of the template 110 and the alignment mark of the pattern-transferred substrate 100. Subsequently, the calculation to align the template stage 21 with the substrate stage 11 is performed based on the misalignments in order to correct the misalignments.

The process for calculating the template height is a process in which the template height at the position at which the alignment mark is formed on the template 110 is calculated with the alignment mark of the template 110 and the alignment mark of the pattern-transferred substrate 100, or with the alignment mark of the template 110 and the reference mark of the reference mark stand 14.

The process for correcting the magnification is a process in which a predetermined calculation is performed based on the template height in order to calculate the stress for correcting the magnification of the template 110. Subsequently, a signal for generating the calculated stress is given to the pressurization portions 24.

A method for correcting the misalignment with the alignment scope 30, and a method for measuring the height with the alignment scope 30 will be described next. A method for correcting the misalignment with the alignment scope 30 will be described first.

Figure 6A:
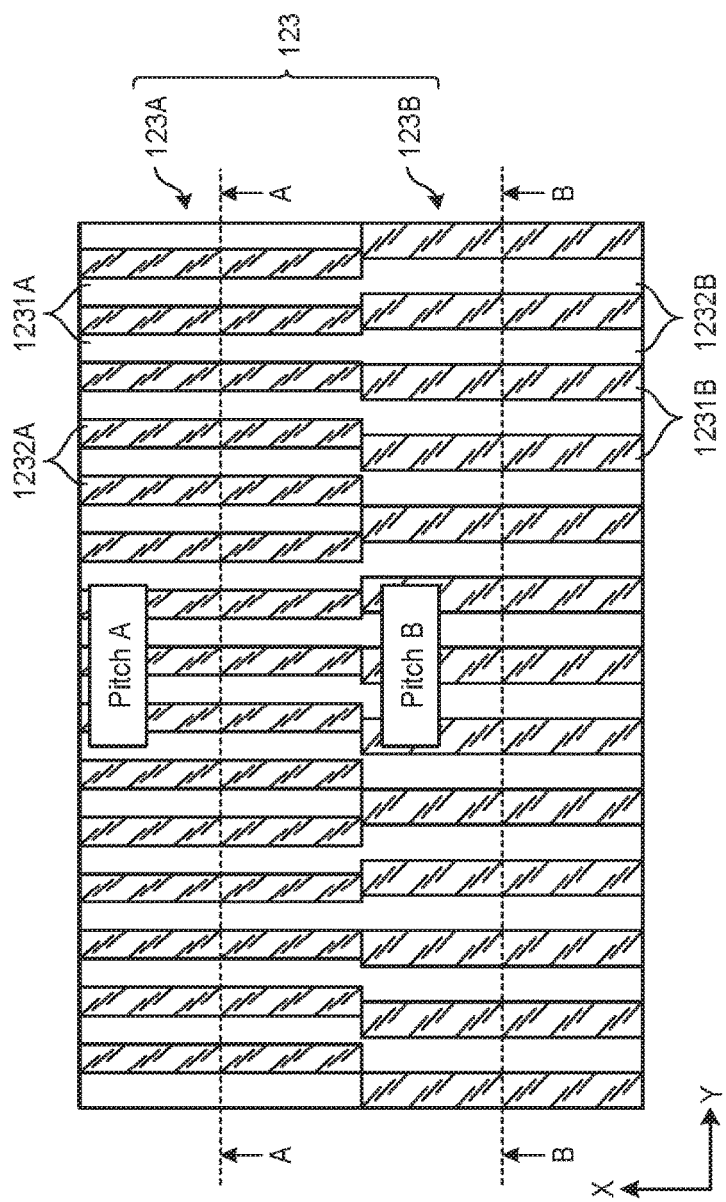
FIGS. 6A to 6C are views of an exemplary misalignment-detecting alignment mark provided on the template.
Figure 6B:
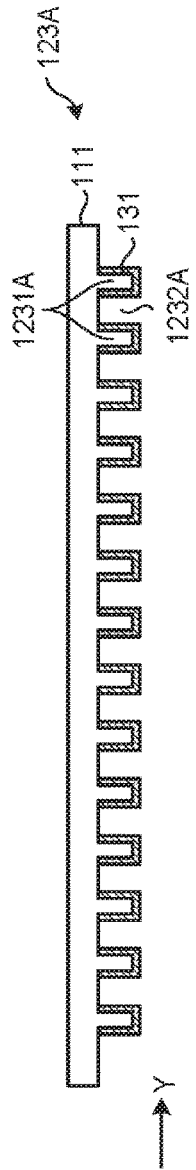
Figure 6C:
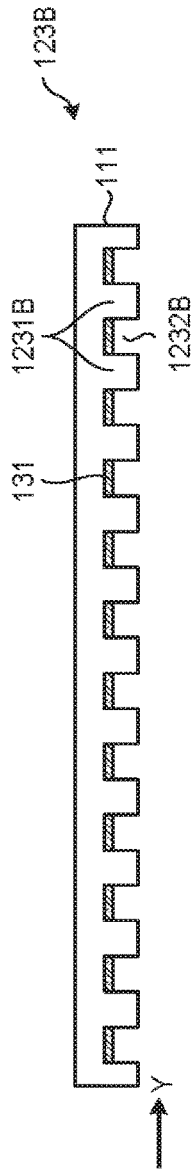
Figure 7:
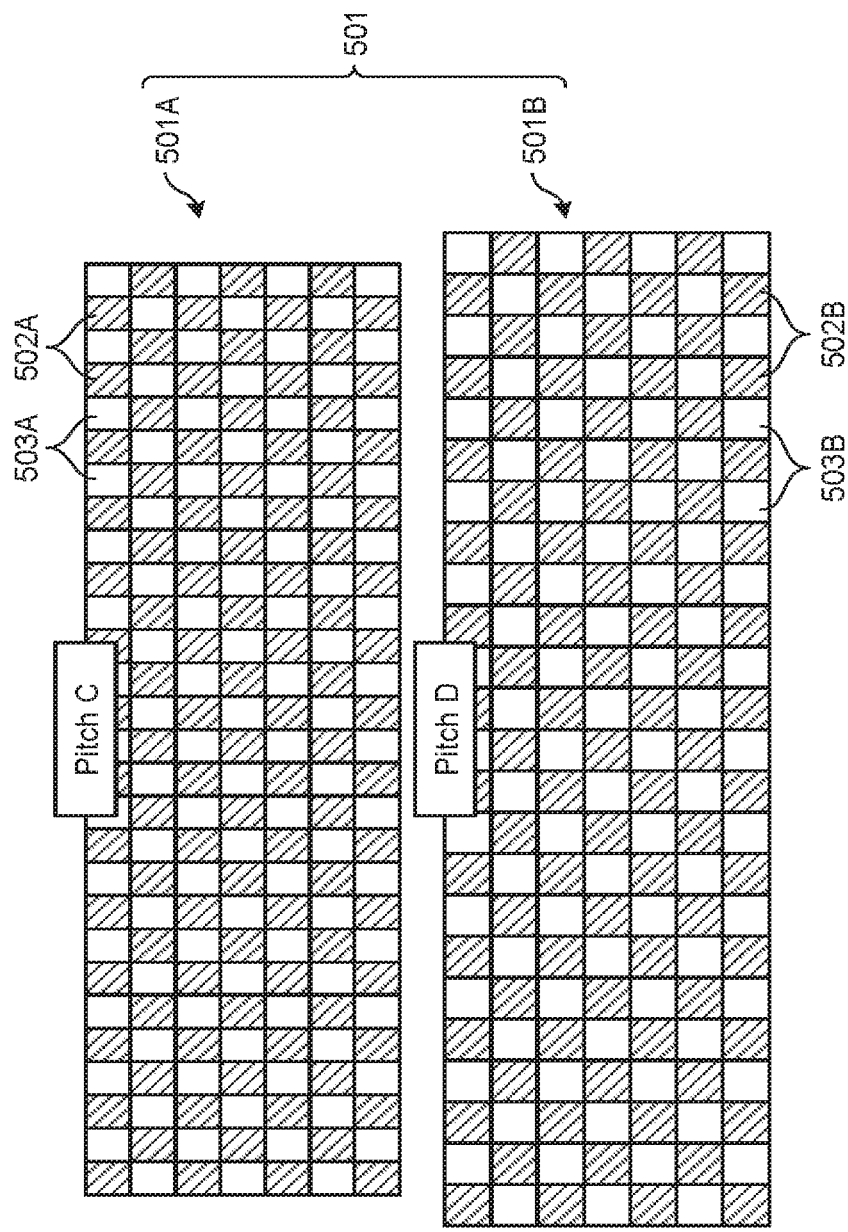
FIG. 7 is a plan view of exemplary alignment marks provided on a pattern-transferred substrate.

FIGS. 5A and 5B are schematic views of an exemplary configuration of the template. FIG. 5A is a cross-sectional view of the template. FIG. 5B is a plan view of the pattern-formed surface of the template. FIGS. 6A to 6C are views of exemplary misalignment-detecting alignment marks provided on the template. FIG. 6A is a plan view. FIG. 6B is a cross-sectional view taken along line A-A in FIG. 6A. FIG. 6C is a cross-sectional view taken along line B-B in FIG. 6A. FIG. 7 is a plan view of exemplary alignment marks provided on a pattern-transferred substrate.

The template 110 is a template substrate 111 on which a convex and concave transfer pattern is formed. The template substrate 111 is made of a material such as quartz or fluorite that transmits ultraviolet. The template substrate 111 has a mesa structure in which the surface of a center region that is to be imprinted on the pattern-transferred substrate 100 to be processed protrudes from the peripheral region. The protruding region in the template substrate 111 is referred to as a mesa surface 1111, and the surface other than the mesa surface 1111 is referred to as an off-mesa surface 1112. The mesa surface 1111 protrudes from the off-mesa surface 1112, for example, by tens of micrometers (μm). The template 110 is provided such that the mesa surface 1111 faces the pattern-transferred substrate 100.

The mesa surface 1111 is provided with a main pattern placement region $R_M$ on which the main pattern 121 for forming a device is placed, and an auxiliary pattern placement region $R_S$ on which auxiliary patterns such as alignment marks 122 are placed. In a planar view, the main pattern placement region $R_M$ is, for example, a rectangular region, and the auxiliary pattern placement region $R_S$ is a rectangular-ring-shaped region provided on the outer periphery of the main pattern placement region $R_M$. Note that the main pattern placement region $R_M$ and the auxiliary pattern placement region $R_S$ form a shot region (or an imprint region).

The main pattern 121 is a pattern for forming, for example, a semiconductor device. A memory forming pattern for forming a NAND flash memory, or a peripheral circuit forming pattern for forming a peripheral circuit that drives the NAND flash memory is cited as an example of the pattern for forming a semiconductor device. A line-and-space pattern can be cited as an example of the memory forming pattern. The line-and-space pattern is a pattern in which line-shaped concave patterns are placed at predetermined intervals in a direction perpendicular to the direction in which the concave patterns extend. The line-shaped pattern is less than or equal to tens of nanometers (nm) in width, for example, in which a word line is formed. The concave portion of the main pattern 121 is, for example, tens of nanometers (nm) in depth.

The alignment mark 122 is a mark that is provided in correspondence with the alignment mark that is formed on the to-be-processed layer in the pattern-transferred substrate 100, and that is used to for the alignment of the template 110. In this example, a position-adjusting alignment mark 123 and a height-measuring alignment mark 124 are provided as the alignment mark 122.

When correcting the misalignment, line-and-space diffraction gratings are used as the alignment mark 123 as illustrated in FIGS. 6A to 6C. In this example, two types of alignment marks 123, the alignment mark 123A with pitches A and the alignment mark 123B with pitches B, are adjacent to each other. The pitch B has a value different from the value of the pitch A.

The alignment mark 123A with the pitches A is a pattern in which a plurality of line-shaped convex patterns 1231A is arranged with the pitches A in a direction perpendicular to the direction in which the line-shaped convex patterns 1231A extend. In the example, the convex patterns 1231A extend in the X direction. A metal film 131 is formed on the surface and side surface of each of the convex patterns 1231A. When the template 110 is made of quartz, an optical coefficient of the template 110 corresponds to an optical coefficient of the resist. This hinders the alignment while the resist is filled in the concave patterns 1232A of the template 110 (the patterns each formed between the adjacent convex patterns 1231A). In light of the foregoing, each of the convex patterns 1231A is applied with the metal film 131. This application changes the optical coefficient for the incident light. This enables In-situ alignment.

The alignment mark 123B with the pitches B is a pattern in which a plurality of line-shaped convex patterns 1231B is arranged with the pitches B in a direction perpendicular to the direction in which the line-shaped convex patterns 1231B extend. Similarly to the alignment mark 123A, the convex patterns 1231B extend in the X direction in this example. The width of the convex pattern 1231B differs from the width of the convex pattern 1231A of the alignment mark 123A with pitches A. The metal film 131 is formed on the bottom of each concave pattern 1232B.

Note that, when the alignment mark 123 formed on the template 110 is formed by line-and-space diffraction gratings as illustrated in FIGS. 6A to 6C, the Y direction that is the direction in which the convex patterns 1231A, and 1231B (or the concave patterns 1232A, and 1232B) are arranged is the metric direction, and the X direction is the non-metric direction.

On the other hand, an alignment mark 501 provided on the to-be-processed layer is formed by the diffraction gratings in a checker pattern as illustrated in FIG. 7. In this example, two types of alignment marks 501, i.e., the alignment mark 501A with pitches C and the alignment mark 501B with pitches D, are adjacent to each other. The pitch D has a value different from the value of the pitch C.

The alignment mark 501A with the pitches C is a pattern in which rectangular convex patterns 502A are arranged with the pitches C in the X direction and the Y direction. Portions surrounded by the convex patterns 502A are rectangular concave patterns 503A.

The alignment mark 501B with the pitches D is a pattern in which rectangular convex patterns are arranged with the pitches D in the X direction and the Y direction. Portions surrounded by convex patterns 502B are rectangular concave patterns 503B.

Figures 8A, 8B, 8C:
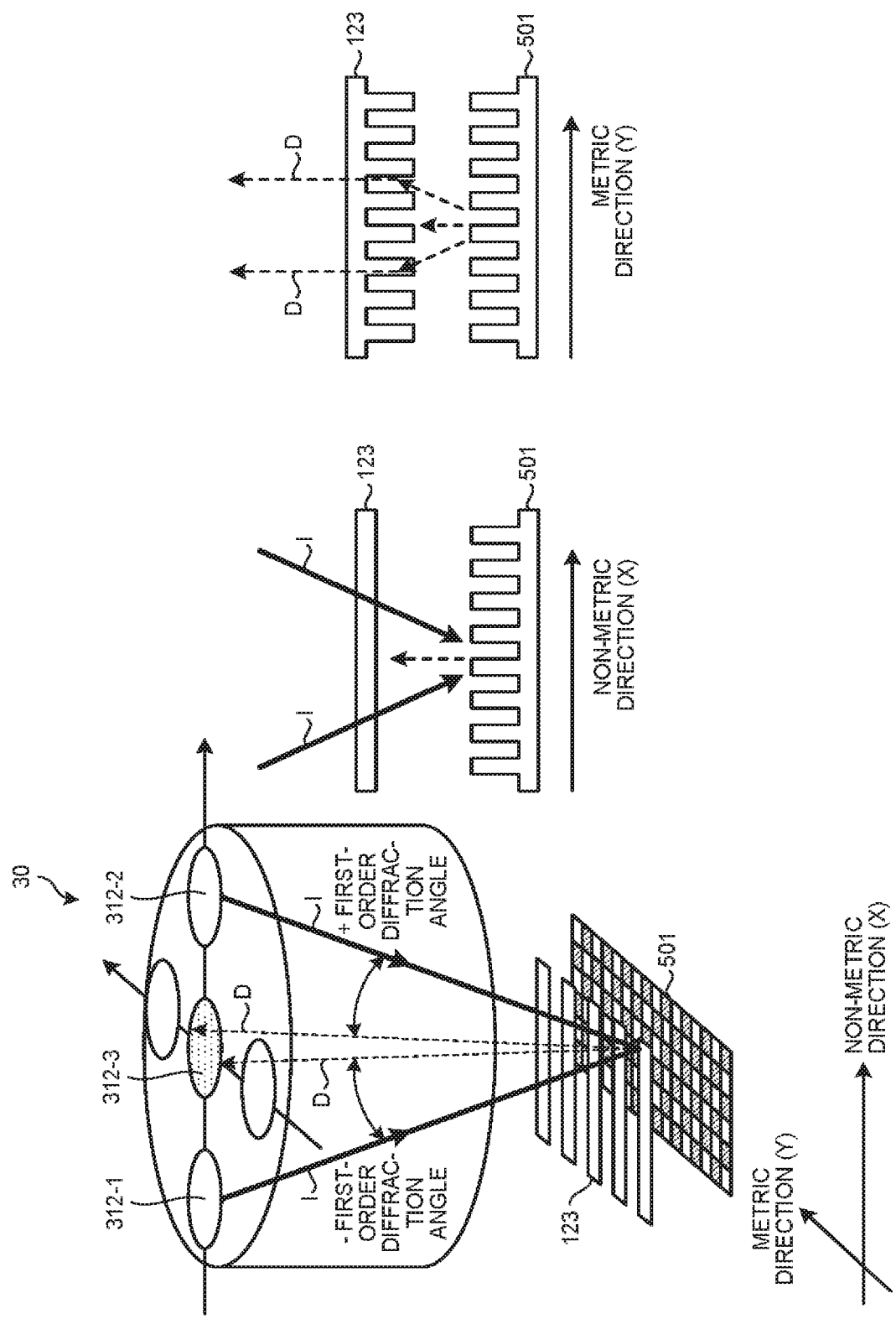
FIGS. 8A to 8C are schematic views of a method for detecting the misalignment between the template and a to-be-processed layer.

FIGS. 8A to 8C are schematic views of a method for detecting the misalignment between the template and the to-be-processed layer. FIG. 8A is a schematic view of a method for detecting the misalignment with the alignment scope. FIG. 8B is a view of a light entering the alignment marks of the template and the to-be-processed layer while the non-metric direction is viewed. FIG. 8C is a view of the light entering the alignment marks of the template and the to-be-processed layer while the metric direction is viewed. Note that the line patterns forming the alignment mark 123 of the template 110 extend in the X direction in this example.

When correcting the misalignment, the alignment mark 501 of the to-be-processed layer is aligned with the alignment mark 123 of the template 110, and the alignment scope 30 is placed at a position at which the aligned alignment marks 123 and 501 can simultaneously be detected. In accordance with the instruction from the control arithmetic unit 51, the light sources 321 are placed on the light paths formed by the first and second light input and output units 312-1 and 312-2, and the light reception sensor 322 is placed on the light path formed by the third light input and output unit 312-3 in the alignment scope 30.

After that, the light source 321 emits an incident light I with a predetermined wavelength. The incident light I is emitted through the first and second light input and output units 312-1 and 312-2 to the aligned alignment marks 123 and 501 at ±first-order diffraction angles in the non-metric direction. As illustrated in FIG. 8B, the incident light I passes through a part on which the metal film 131 is not formed on the template 110 (in this example, the concave pattern 1232A) and is vertically diffracted by the alignment mark 501 in a checker pattern in the non-metric direction (the X direction in the drawing) of the pattern-transferred substrate 100. As illustrated in FIG. 8C, the diffracted light D generates moiré interference fringes in the metric direction (the Y direction in the drawing) between the pattern-transferred substrate 100 and the template 110. Then, the misalignment between the pattern-transferred substrate 100 and the template 110 is corrected while the moiré interference fringes are observed with the light reception sensor 322.

The correction of the misalignment between the template 110 and the pattern-transferred substrate 100 has been described in this example. Note that, however, the misalignment between the template 110 and the reference mark of the reference mark stand 14 is corrected in the same manner.

The method for correcting the misalignment with the alignment scope 30 has been described above. A method for measuring the height of the template 110 with the alignment scope 30 will be described next.

FIGS. 9A to 9C are views of exemplary height-measuring alignment marks provided on the template. FIG. 9A is a plan view. FIG. 9B is a cross-sectional view taken along line C-C in FIG. 9A. FIG. 9C is a cross-sectional view taken along line D-D in FIG. 9A. Note that the alignment mark 501 provided on the pattern-transferred substrate 100 is the same as the alignment mark 501 described with reference to FIG. 7. Thus, the description will be omitted.

When measuring the template height, line-and-space asymmetric diffraction gratings are used as an alignment mark 124 as illustrated in FIGS. 9A to 9C, differently from the misalignment-correcting alignment mark 123 illustrated in FIGS. 6A to 6C. In this example, alignment marks 124A and 124B with different pitches are adjacent to each other.

On the cross-sectional surface of the pattern of the asymmetric diffraction gratings with pitches E as illustrated in FIG. 9B, a plurality of line-shaped convex patterns 1241A are arranged on the template substrate 111 with the pitches E in a direction perpendicular to the direction in which the line-shaped convex patterns 1241A extend. A metal film 131 is formed on a region extending from a first end on the side surface to a place on the lower surface of the convex pattern 1241A. The length of the region in which the metal film 131 is formed on the lower surface of the convex pattern 1241A is shorter than the width of the convex pattern 1241A. Hereinafter, a part covered with the metal film 131 in the convex pattern 1241A is referred to as a light-blocking portion 1242A, and a part that is not covered with the metal film 131 is referred to as a transmission portion 1243A.

In the present embodiment, the transmission light passing through the transmission portion 1243A of the convex pattern 1241A has a phase $\varphi 1$, and the transmission light passing through a concave pattern 1244A (the transmission portion) has a phase $\varphi 2$. The height of the convex pattern 1241A (or the depth of the concave pattern 1244A) is set such that the difference between the phase $1l$ and the phase $\varphi^2$ (hereinafter, referred to as phase difference) has an angle except for 180 degrees. This setting can generate the difference of diffraction efficiency between the +first-order diffracted light and the −first-order diffracted light that are diffracted at the aligned alignment marks 124A and 501. Note that it is more preferable to set the phase difference at 90 degrees because the difference of diffraction efficiency between the +first-order diffracted light and the −first-order diffracted light increases.

Furthermore, on the surface perpendicular to a direction in which the patterns of the asymmetric diffraction gratings extend, the light-blocking portion 1242A has a width W1, the transmission portion 1243A of the convex pattern 1241A has a width W2, and the concave pattern 1244A has a width W3. When W1:W2:W3=2:1:1 holds, one of the diffraction efficiency of the −first-order diffracted light and the +first-order diffracted light (in this example, the −first-order diffracted light) can be zero. In other words, the patterns of the asymmetric diffraction gratings are arranged such that the phase difference is set at 90 degrees and W1:W2:W3=2:1:1 holds. This arrangement can prevent the −first-order diffracted light from being generated at the aligned alignment marks 124A and 501. In FIG. 9B, the concave pattern 1244A, the light-blocking portion 1242A of the convex pattern 1241A, and the transmission portion 1243A are arranged in this order in the positive direction of the Y direction.

On the cross-sectional surface of the pattern of the asymmetric diffraction gratings with the pitches F as illustrated in FIG. 9C, a plurality of line-shaped convex patterns 1241B are arranged with the pitches F on the template substrate 111 in a direction perpendicular to the direction in which the line-shaped convex patterns 1241B extend. The pitch F is wider than the pitch E. In the pattern of the asymmetric diffraction gratings with the pitches F, the metal film 131 is also provided on the lower and side surfaces of the convex pattern 1241B such that W1:W2:W3=2:1:1 holds, and the height of the convex pattern 1241B (or the depth of the concave pattern 1244B) is set such that the phase difference has an angle except for 180 degrees, preferably has an angle of 90 degrees. In FIG. 9C, the concave pattern 1244B, the transmission portion 1243B of the convex pattern 1241B, and the light-blocking portion 1242B are arranged in this order in the positive direction of the Y direction, differently from the arrangement in FIG. 9B.

FIGS. 10A to 10C are schematic views of a method for measuring the distance between the template and the to-be-processed layer. FIG. 10A is a schematic view of a method for measuring the template height with the alignment scope. FIG. 10B is a view of a light entering the alignment marks of the template and the to-be-processed layer while the metric direction is viewed. FIG. 10C is a view of the light entering the alignment marks of the template and the to-be-processed layer while the non-metric direction is viewed.

When measuring the template height, the alignment mark 501 of the to-be-processed layer is aligned with the alignment mark 124 of the template 110, and the alignment scope 30 is placed at a position at which the aligned alignment marks 124 and 501 can simultaneously be detected. In accordance with the instruction from the control arithmetic unit 51, the light reception sensors 322 are placed on the light paths formed by the first and second light input and output units 312-1 and 312-2, and the light source 321 is placed on the light path formed by the third light input and output unit 312-3 in the alignment scope 30.

After that, the light source 321 emits an incident light I with a predetermined wavelength. The incident light I is emitted through the third light input and output unit 312-3 to the aligned alignment marks 124 and 501 in a vertical direction. As illustrated in FIG. 10B, the incident light I passes through the transmission portion 1243 and the concave pattern 1244 of the alignment mark 124 of the template 110 and is diffracted. At that time, the −first-order diffracted light disappears from the asymmetric diffraction gratings with the pitches E in the metric direction (the Y direction in the drawing), and two-beam interference of a zero-order diffracted light and the +first-order diffracted light occurs. A standing wave W appears between the zero-order diffracted light and the + first-order diffracted light. The standing wave W appears in a direction of an angle of about 45 degrees between the template 110 and the pattern-transferred substrate 100, and enters the pattern-transferred substrate 100.

As illustrated in FIG. 10C, in the non-metric direction (the X direction in the drawing), the standing wave W is diffracted at the diffraction gratings in a checker pattern in the pattern-transferred substrate 100. Subsequently, the diffracted light D enters the light reception sensors 322 placed on the light paths formed by the first and second light input and output units 312-1 and 312-2 in the alignment scope 30.

In this example, the template 110 is attached to the template stage 21. As a result, the pattern-formed surface of the template 110 is not flat, in other words, the template is not even in thickness. Thus, the distance from the pattern-transferred substrate 100 to the template 110 in the vertical direction varies depending on the position on the template 110. This means that the light focuses at the standard distance (reference distance) between the pattern-transferred substrate 100 and the template 110 while the light defocuses at a distance that is not the reference distance. When the defocus is generated, the length of the standing wave W changes as described with reference to FIG. 10B. Thus, the positions of the diffracted lights entering the light reception sensors 322 of the alignment scope 30 change. In other words, a variation in template height is measured as the difference of the positions at which the diffracted light enters the light reception sensors 322.

On the other hand, in the alignment mark 124B with the pitches F, the order in which the light-blocking portion 1242B, the transmission portion 1243B of the convex pattern 1241B, and the concave pattern 1244B are arranged is different from the order in the alignment mark 124A with the pitches E. Thus, the +first-order diffracted light disappears in the metric direction, two-beam interference of the zero-order diffracted light and the −first-order diffracted light occurs, and a standing wave appears between the zero-order diffracted light and the −first-order diffracted light. The standing wave travels in a direction opposite to the direction in the alignment mark 124A with the pitches E. As a result, the position at which the diffracted light enters the light reception sensor 322 moves due to a variation in height of the template 110 in a direction opposite to the direction in the alignment mark 124A with the pitches E.

Each of the light reception sensors 322 placed on the light paths formed by the first and second light input and output units 312-1 and 312-2 has a predetermined size. Thus, if a part of the diffracted light is not included in the light reception sensor 322, the signal intensity of the diffracted light received by the light reception sensor 322 decreases. In contrast, when a large amount of diffracted light enters the light reception sensor 322, the signal intensity of the diffracted light received by the light reception sensor 322 increases. In other words, a variation in template height changes the signal intensity of the diffracted light entering the light reception sensor 322.

Figure 11:
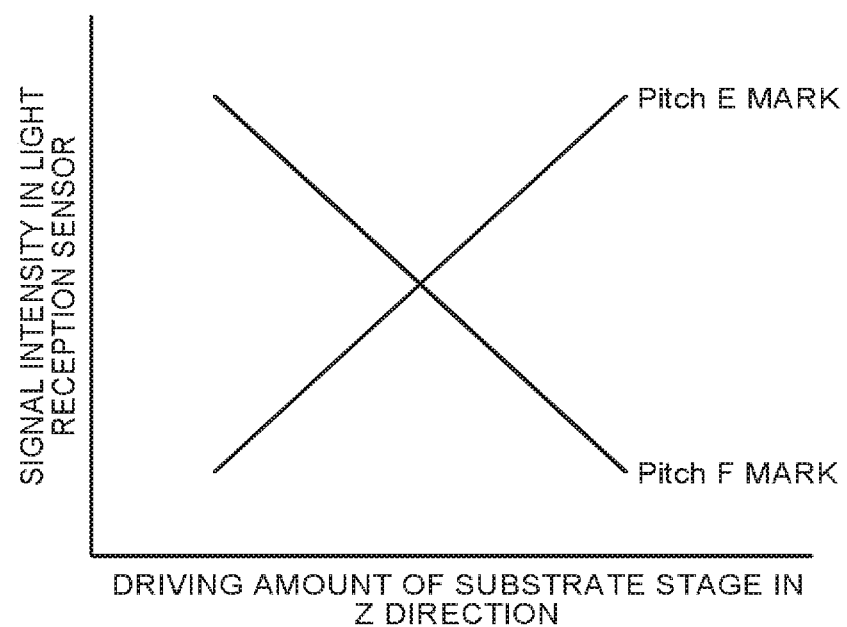
FIG. 11 is a schematic view of the relationship between the signal intensity of a diffracted light and the driving amount of a substrate stage in a Z direction.

In light of the foregoing, the signal intensity in the light reception sensor 322 when the height of the pattern-transferred substrate 100, namely, the driving amount of the substrate stage 11 in the Z direction is changed is measured. The signal intensity is measured at both of the alignment mark 124A with the pitches E and the alignment mark 124B with the pitches F. FIG. 11 is a schematic view of the relationship between the signal intensity of the diffracted light and the driving amount of the substrate stage in the Z direction. In the drawing, the driving amount of the substrate stage 11 in the Z direction is shown on the horizontal axis, and the signal intensity of the diffracted light received by the light reception sensor 322 is shown on the vertical axis. When the driving amount of the substrate stage 11 in the Z direction increases, the diffracted light moves from the position at which a part of the diffracted light is not included in the light reception sensor 322 to the position at which the diffracted light is included in the light reception sensor 322 in the alignment mark 124A with the pitches E. As the result, the area of the diffracted light entering the light reception sensor 322 increases, and the signal intensity increases. On the other hand, the diffracted light moves from the position at which the diffracted light is included in the light reception sensor 322 to the position at which a part of the diffracted light is not included in the light reception sensor 322 in the alignment mark 124B with the pitches F. As the result, the area of the diffracted light entering the light reception sensor 322 decreases, and the signal intensity decreases.

Note that the driving amount of the substrate stage 11 in the Z direction can be changed to the template height. The control arithmetic unit 51 obtains the curves indicating the signal intensities with the two pitches, and the template height at the intersection of the two signal intensity curves is the template height at the position at which the height is measured.

Figure 12:
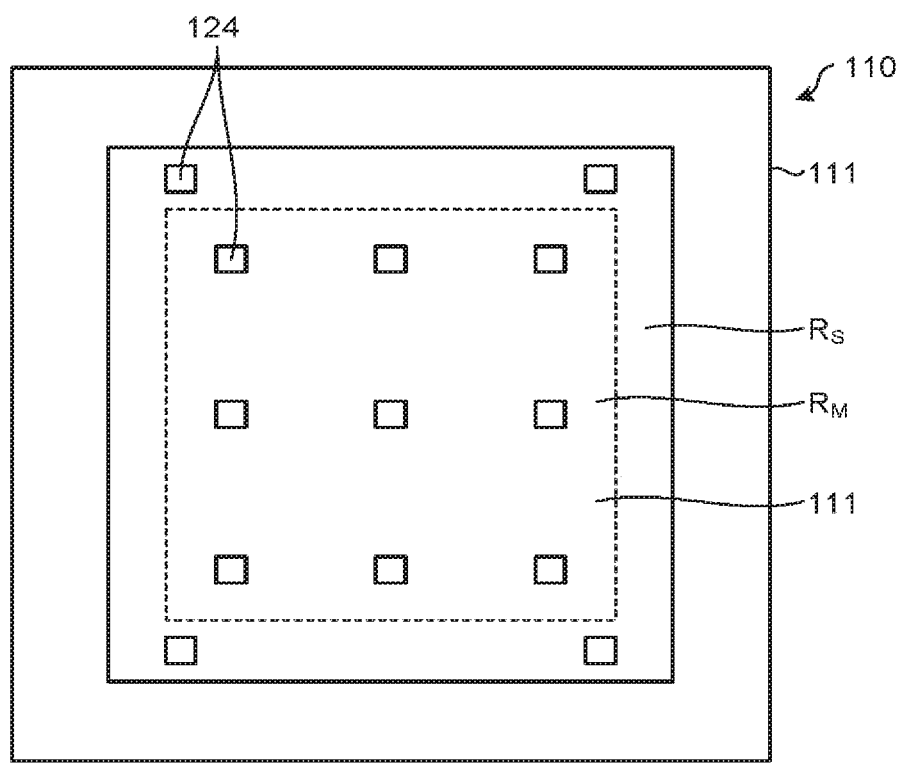
FIG. 12 is a schematic view of an exemplary arrangement of the height-measuring alignment marks on the template.

FIG. 12 is a schematic view of an exemplary arrangement of the height-measuring alignment marks on the template. The height-measuring alignment marks 124 are placed in the auxiliary pattern placement region $R_S$ in FIG. 5B. However, the height-measuring alignment marks 124 can be placed in a region where the main pattern is not placed in the main pattern placement region $R_M$ as illustrated in FIG. 12. Arranging the height-measuring alignment marks 124 as illustrated in FIG. 12 can measure the heights in the whole pattern-formed surface of the template 110.

Figure 13:
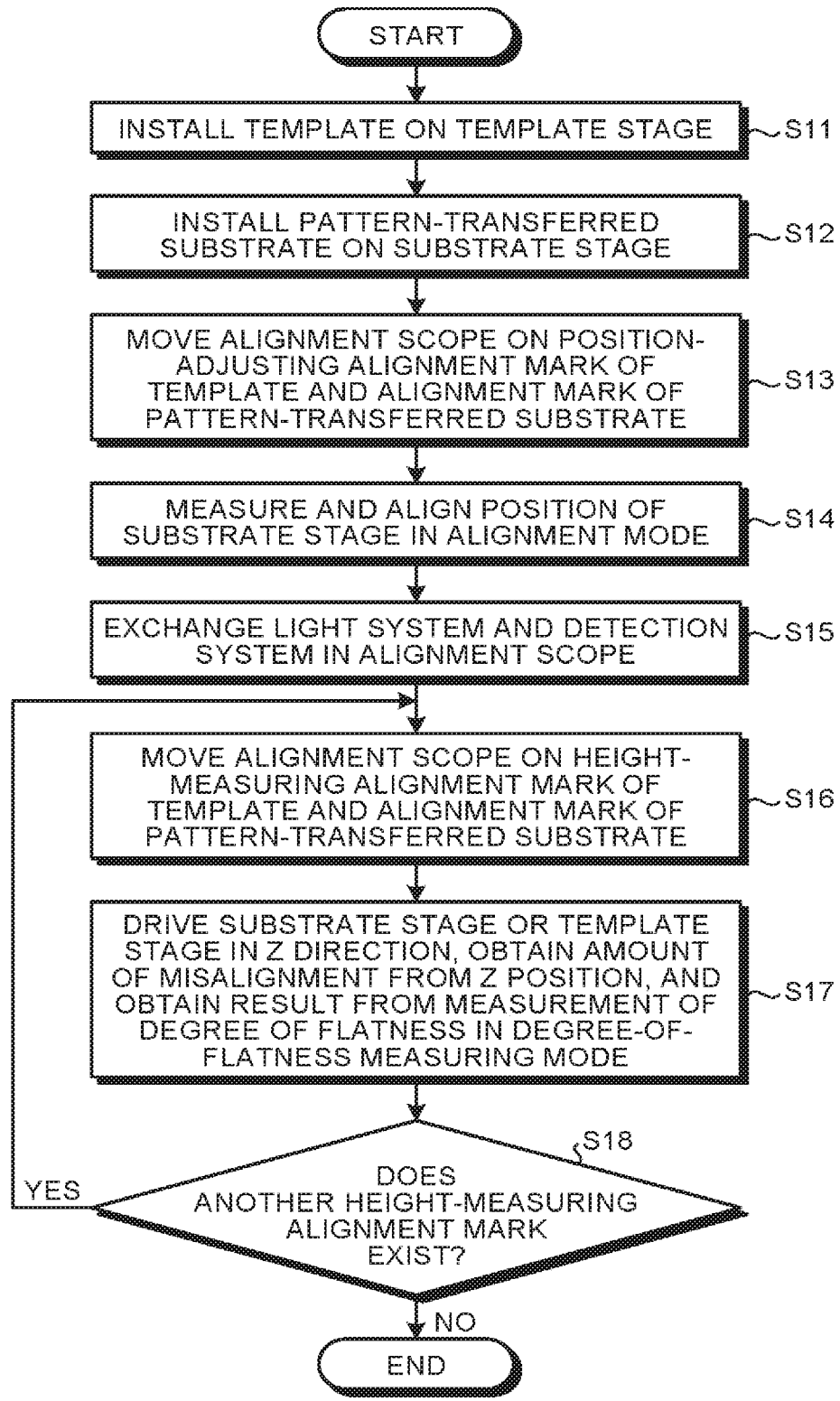
FIG. 13 is a flowchart of exemplary procedures of a method for measuring the height of the template according to the first embodiment.

A method for measuring the template height with the imprint apparatus and the template will be described next. FIG. 13 is a flowchart of exemplary procedures of a method for measuring the height of the template according to the first embodiment. First, the template 110 is installed on the template stage 21 (step S11), and the template 110 is fixed on the template stage 21. Furthermore, the pattern-transferred substrate 100 is installed on the substrate stage 11 (step S12), and the pattern-transferred substrate 100 is fixed on the substrate stage 11 with the chuck 12.

Next, the position-adjusting alignment mark 123 of the template 110 is aligned with the alignment mark of the pattern-transferred substrate 100, and the alignment scope 30 is moved on the two alignment marks (step S13).

After that, the position of the substrate stage 11 is measured and aligned in an alignment mode (step S14). Specifically, as illustrated in FIG. 3A, the light sources 321 are placed on the light paths formed by the first and second light input and output units 312-1 and 312-2, and the light reception sensor 322 is placed on the light path formed by the third light input and output unit 312-3 in the alignment scope 30. An alignment between the pattern-transferred substrate 100 and the template 110 is performed as described with reference to FIGS. 6A to 6C and FIGS. 8A to 8C.

Next, the light system and detection system in the alignment scope 30 are exchanged (step S15). Specifically, the light sources 321 placed on the light paths formed by the first and second light input and output units 312-1 and 312-2 are switched to the light reception sensors 322, and the light reception sensor 322 placed on the light path formed by the third light input and output unit 312-3 is switched to the light source 321 in the alignment scope 30. The light source 321 and the light reception sensors 322 are arranged as illustrated in FIG. 3B.

After that, the height-measuring alignment mark 124 of the template 110 is aligned with the alignment mark of the pattern-transferred substrate 100, and the alignment scope 30 is moved on the two alignment marks (step S16).

Next, the substrate stage 11 or the template stage 21 is driven in the Z direction in a degree-of-flatness measuring mode. The amount of misalignment of the diffracted light from the Z position is obtained, and the result from the measurement of the degree of flatness is obtained (step S17). In this example, the template height at the position of the height-measuring alignment mark 124 is obtained as described with reference to FIGS. 9A to 9C and FIGS. 10A to 10C.

After that, it is determined whether another height-measuring alignment mark 124 exists (step S18). When another height-measuring alignment mark exists (Yes in step S18), the process goes back to step S16. On the other hand, when another height-measuring alignment mark 124 does not exist (No in step S18), the process is terminated.

Note that, when an imprint process is performed, the control arithmetic unit 51 calculates the amount of pressure at which the pressurization portions 24 pressurize the template 110 such that the pattern-formed surface of the template 110 is made flat based on the result of the measurement of the degree of flatness. Then, the control arithmetic unit 51 transmits the signal to the pressurization portions 24.

Based on the information obtained from the process described above, the correction mechanisms 23 adjust the misalignment between the template 110 and the pattern-transferred substrate 100, and the pressurization portions 24 adjust the pressure such that the pattern-formed surface of the template 110 is flat. Then, the imprint process is conducted.

The height of the pattern-formed surface of the template 110 sometimes varies depending on the existence of a particle between the template 110 and the template stage 21, or the chip of the template stage 21. In light of the foregoing, the template height is measured at predetermined intervals of time (for example, once a day or once a week). This measurement can manage the time for maintenance including the time to clean the template stage 21, or the lifetime of the template stage 21.

An imprint method with the imprint apparatus 10 will briefly be described hereinafter. First, the template 110 is aligned with the pattern-transferred substrate 100 in the method described above. Meanwhile, the pressurization portions 24 adjust the pressure on the template 110. Subsequently, the application unit 42 applies a resist on the pattern-transferred substrate 100. After that, the distance between the template 110 and the pattern-transferred substrate 100 in the Z direction is reduced, and the transfer pattern of the template 110 is made in contact with the resist. In the conditions, the light source 41 irradiates the resist with the light to cure the resist. After the resist is cured, the template 110 is removed from the resist. As a result, a resist pattern obtained by transferring the concave and convex shape of the transfer pattern of the template 110 to the resist is formed on the pattern-transferred substrate 100.

After that, by etching the to-be-processed layer using the resist pattern as a mask, the pattern is transferred to the to-be-processed layer.

The position-adjusting alignment mark 123 and the height-measuring alignment mark 124 are separately provided in the above-mentioned description. Note that, however, an alignment mark can be used as both of the misalignment-correcting alignment mark and the height-measuring alignment mark. In such a case, the height-measuring alignment mark 124 illustrated in FIGS. 9A to 9C is used not only for measuring the template height but also for correcting the misalignment.

The template 110 is provided with the two types of height-measuring alignment marks 124 formed by the asymmetric diffraction gratings with different pitches in the first embodiment. The position of the light sources 321 and light reception sensor 322 that are used for the alignment are exchanged in the alignment scope 30. Then, the aligned height-measuring alignment mark 124 of the template 110 and the alignment mark of the pattern-transferred substrate 100 are irradiated with the light. After that, the signal intensity of the diffracted light is measured with the light reception sensor 322. These are repeated while the height of the pattern-transferred substrate 100 or template 110 in the Z direction is changed. Using the height-measuring alignment marks 124 with the two types of pitches to find the signal intensity of the diffracted light, it is possible to find the height of the template 110 at a position at which the height-measuring alignment mark 124 is placed.

If a particle exists between the template stage 21 and the template 110, the template height varies. Continuously conducting the measurement of the template height, it is possible to predict the time to clean the template stage 21. If a part of the template stage 21 is chipped and the degree of flatness is deteriorated, the template height also varies. Continuously conducting the measurement of the template height, it is also to possible to predict the time to replace the template stage 21. Note that, when the time for maintenance including the time to clean the template stage 21 and the time to replace the template stage 21 is detected, the control arithmetic unit 51 outputs the information about the predicted maintenance time, and thus can draw the attention of the user of the imprint apparatus.

For example, the measurement of the template height at a predetermined intervals of time detects a place in which the height of the template 110 varies with time. In such a case, the recipe for dropping the resist on the place can be updated such that the amount of resist to be dropped near the place in which the height varies is changed in accordance with the height. It is possible to maintain the filling characteristics of the resist in an imprint process without the deterioration of the filling characteristics over the course of the time in which the template 110 is used.

The pressure on the template 110 in an imprint process is changed such that a place with a low degree of flatness in the template 110 becomes flat and the template 110 is optimized. It is also possible to uniform the Residual Layer Thickness (RLT) of the residue resist film.

Second Embodiment

In the first embodiment, the height-measuring alignment marks with the two types of pitches are used to obtain the intensity of the diffracted light when the position of the pattern-transferred substrate or template in the Z direction is changed. The template height is measured from the intensity of the diffracted light. In the second embodiment, height-measuring alignment marks with a type of pitches are used to measure the template height.

An imprint apparatus according to the second embodiment has the same configuration as the configuration described in the first embodiment, and thus the description will be omitted. Differently from the first embodiment, only the height-measuring alignment marks with a type of pitches are placed in the configuration of the template, for example, in FIG. 9A.

Figure 14:
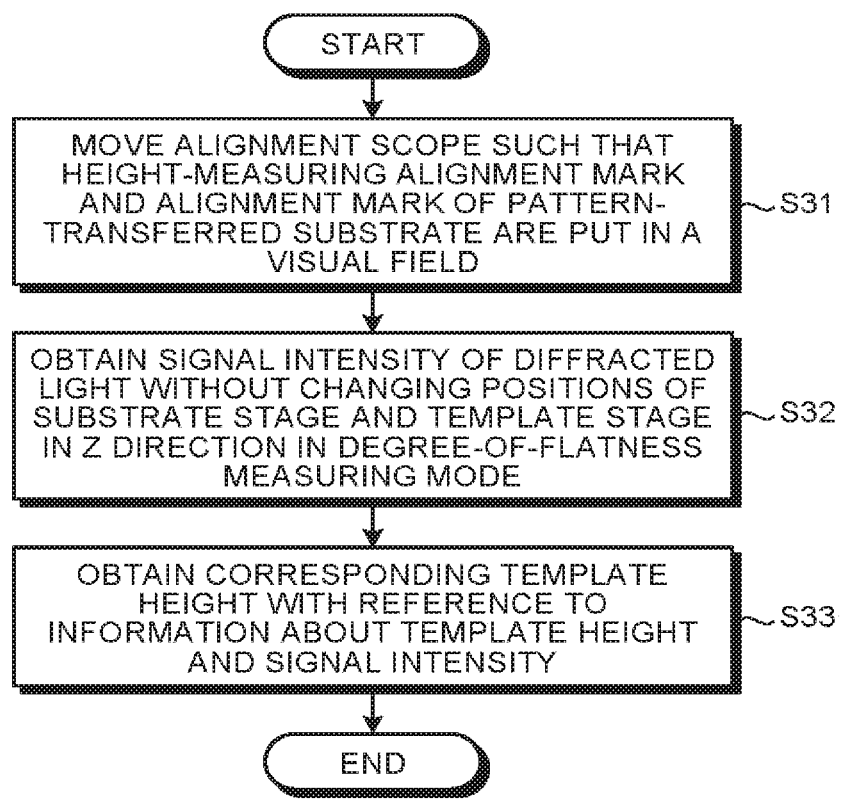
FIG. 14 is a flowchart of exemplary procedures of a method for measuring the height according to a second embodiment.

The measurement of the height will be described next. FIG. 14 is a flowchart of exemplary procedures of a method for measuring the height according to the second embodiment. The flowchart shows the process corresponding to the process in step S17 of FIG. 13.

First, the alignment scope 30 is moved to a position in which the height-measuring alignment mark 124 of the template 110 and the alignment mark of the pattern-transferred substrate 100 can simultaneously be detected (step S31). Subsequently, the substrate stage 11 and the template stage 21 are placed at predetermined positions in the Z direction. Then, the light source 41 irradiates the aligned height-measuring alignment mark 124 with a light in the degree-of-flatness measuring mode to obtain the signal intensity of the diffracted light (step S32).

After that, the control arithmetic unit 51 obtains the template height corresponding to the obtained signal intensity with reference to the held information about the template height and the signal intensity (step S33). After the process described above, the process is completed.

Figure 15:
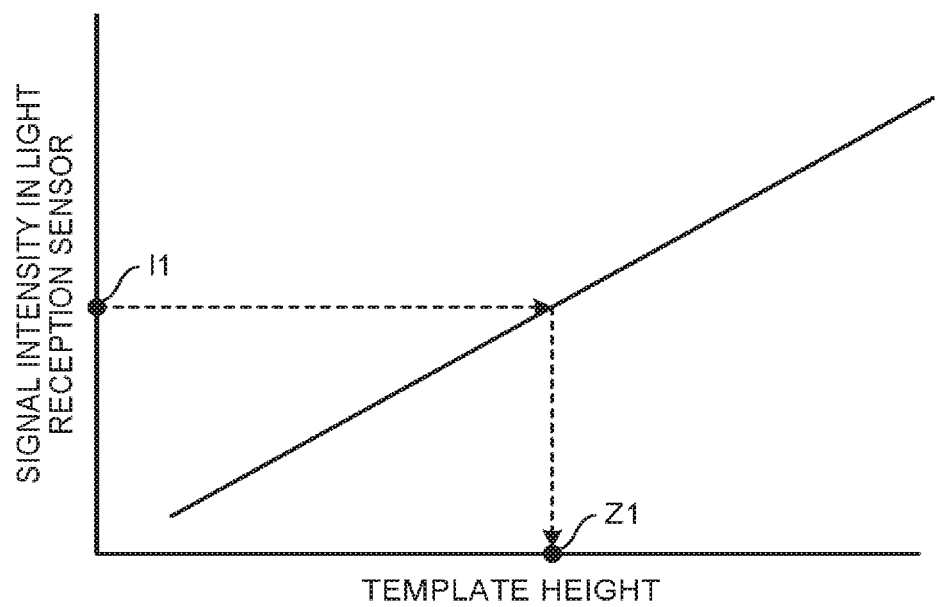
FIG. 15 is a view of exemplary information about the height of the template and signal intensity.

FIG. 15 is a view of exemplary information about the template height and the signal intensity. Basically, FIG. 15 is the same as FIG. 11 illustrating the relationship between the driving amount of the substrate stage in the Z direction and the signal intensity in the light reception sensor. The information about the template height and the signal intensity indicates the relationship between the template height and the signal intensity of the diffracted light in the light reception sensor 322 when the distance between the template 110 and the pattern-transferred substrate 100 is a predetermined distance. Note that the illustrated relationship is an example, and the graph may show a line falling from top left to bottom right depending on the order of arrangement of the transmission portion 1243 and light-blocking portion 1242 in a convex pattern, and the concave pattern 1244 in the height-measuring alignment mark 124.

When the signal intensity in the light reception sensor 322 is Ii, it can be found that the template height is Z1 from the information about the template height and the signal intensity illustrated in FIG. 15.

The second embodiment can bring about the same effect as the effect by the first embodiment.

In the embodiments, the alignment mark on the pattern-transferred substrate 100 is used to measure the degree of flatness of the template 110. Note that, however, the alignment mark provided on the reference mark stand 14 can be used in place of the alignment mark on the pattern-transferred substrate 100.

In the embodiments, the alignment marks and degree-of-flatness measuring marks are with the two or less types of pitches. However, the alignment marks can be with three or more types of pitches.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imprint method comprising:
    aligning a first mark of a substrate to be processed with a second mark of a template;
    placing a first light source on a first light path and placing a first light reception sensor on a second light path in an alignment scope, the alignment scope forming the first light path and the second light path, the first light path through which an electromagnetic Wave with a predetermined wavelength is led to the aligned first and second marks from a direction of a first-order diffraction angle, the first-order diffraction angle being an angle of a first-order diffracted light when the first and second marks are irradiated with the electromagnetic wave from a direction perpendicular to the first and second marks, the second light path through which a first diffracted light is led, the first diffracted light vertically being diffracted at the aligned first and second marks;
    receiving the first diffracted light from the first and second marks with the first light reception sensor, the first diffracted light being obtained by emitting the electromagnetic wave from the first light source;
    correcting misalignment between the template and the substrate to be processed using the first diffracted light;
    aligning the first mark with a third mark of the template;
    placing a second light source on the second light path and placing a second light reception sensor on the first light path in the alignment scope;
    receiving a second diffracted light from the first and third marks with the second light reception sensor, the second diffracted light being obtained by emitting the electromagnetic wave from the second light source;
    calculating a template height at the third mark from an intensity of the received second diffracted light; and
    adjusting a pressure at which a reverse surface of the template is pressurized based on the template height, wherein
    the third mark includes a pattern, the pattern giving a priority to one first-order diffracted light over the other first-order diffracted light of ±first-order diffracted lights diffracted at the third mark, and
    the calculating of the template height includes
        measuring a signal intensity of the second diffracted light diffracted at the aligned first and third marks while a predetermined distance is placed between the template and the substrate to be processed, and
        finding the template height corresponding to the measured signal intensity with reference to information indicating a relationship between a height of a pattern-formed surface of the template from a template stage and the signal intensity of the second diffracted light.

2. The imprint method according to claim 1, wherein, in a case that a plurality of third marks exists, the receiving a second diffracted light and the calculating a template height are performed for all of the third marks.

3. The imprint method according to claim 1, wherein, in the placing of the second light source and the second light reception sensor, the first light source placed on the first light path is placed on the second light path and is used as the second light source, the first light reception sensor placed on the second light path is placed on the first light path and is used as the second light reception sensor.

4. The imprint method according to claim 3, wherein, in the placing of the second light source and the second light reception sensor, the first light source and the first light reception sensor are switched while a substrate stage that holds the substrate to be processed is stationary.

5. An imprint method comprising:
aligning a first mark of a substrate to be processed with a second mark of a template;
placing a first light source on a first light path and placing a first light reception sensor on a second light path in an alignment scope, the alignment scope forming the first light path and the second light path, the first light path through which an electromagnetic wave with a predetermined wavelength is led to the aligned first and second marks from a direction of a first-order diffraction angle, the first-order diffraction angle being an angle of a first-order diffracted light when the first and second marks are irradiated with the electromagnetic wave from a direction perpendicular to the first and second marks, the second light path through which a first diffracted light is led, the first diffracted light vertically being diffracted at the aligned first and second marks;
receiving the first diffracted light from the first and second marks with the first light reception sensor, the first diffracted light being obtained by emitting the electromagnetic wave from the first light source;
correcting misalignment between the template and the substrate to be processed using the first diffracted light;
aligning the first mark with a third mark of the template;
placing a second light source on the second light path and placing a second light reception sensor on the first light path in the alignment scope;
receiving a second diffracted light from the first and third marks with the second light reception sensor, the second diffracted light being obtained by emitting the electromagnetic wave from the second light source;
calculating a template height at the third mark from an intensity of the received second diffracted light; and
adjusting a pressure at which a reverse surface of the template is pressurized based on the template height, wherein
the third mark includes a first pattern giving a priority to one first-order diffracted light over the other first-order diffracted light of ±first-order diffracted lights diffracted at the third mark, and a second pattern giving a priority to the other first-order diffracted light over the one first-order diffracted light,
in the receiving of the second diffracted light, a first process and a second process are conducted while the distance between the template and the substrate to be processed is changed, the first process being a process receiving the second diffracted light when the first mark and the first pattern are irradiated with the electromagnetic wave, the second process being a process receiving the second diffracted light when the first mark and the second pattern are irradiated with the electromagnetic wave, and
the calculating of the template height includes
calculating first signal intensity and second signal intensity of the second diffracted light corresponding to the distance, the first signal intensity being obtained in the first process, the second signal intensity being obtained in the second process,
calculating the distance at which the first signal intensity is identical to the second signal intensity, and
finding the template height corresponding to the distance at which the first signal intensity is identical to the second signal intensity.

6. The imprint method according to claim 5, wherein, in a case that a plurality of third marks exists, the receiving a second diffracted light and the calculating a template height are performed for all of the third marks.

7. The imprint method according to claim 5, wherein, in the placing of the second light source and the second light reception sensor, the first light source placed on the first light path is placed on the second light path and is used as the second light source, the first light reception sensor placed on the second light path is placed on the first light path and is used as the second light reception sensor.

8. The imprint method according to claim 7, wherein, in the placing of the second light source and the second light reception sensor, the first light source and the first light reception sensor are switched while a substrate stage that holds the substrate to be processed is stationary.

9. An imprint method comprising:
aligning a first mark of a substrate to be processed with a second mark of a template;
placing a first light source on a first light path and placing a first light reception sensor on a second light path in an alignment scope, the alignment scope forming the first light path and the second light path, the first light path through which are electromagnetic wave with a predetermined wavelength is led to the aligned first and second marks from a direction of a first-order diffraction angle, the first-order diffraction angle being an angle of a first-order diffracted light when the first and second marks are irradiated with the electromagnetic wave from a direction perpendicular to the first and second marks, the second light path through which a first diffracted light is led, the first diffracted light vertically being diffracted at the aligned first and second marks;
receiving the first diffracted light from the first and second marks with the first light reception sensor, the first diffracted light being obtained by emitting the electromagnetic wave from the first light source;
correcting misalignment between the template and the substrate to be processed using the first diffracted light;
aligning the first mark with a third mark of the template;
placing a second light source on the second light path and placing a second light reception sensor on the first light path in the alignment scope;
receiving a second diffracted light from the first and third marks with the second light reception sensor, the second diffracted light being obtained by emitting the electromagnetic wave from the second light source;
calculating a template height at the third mark from an intensity of the received second diffracted light; and
adjusting a pressure at which a reverse surface of the template is pressurized based on the template height, wherein
the third mark includes line-shaped first concave patterns and first convex patterns that are alternately placed in a width direction,
the first convex pattern includes:
a first light-blocking portion that is a region including a first side surface in the width direction and being covered with a metal film; and a first translucent portion that includes a second side surface in the width direction and is not covered with the metal film, a ratio of the first light-blocking portion, the first translucent portion, and the first concave pattern in the width direction is 2:1:1, and a difference in height between the first concave pattern and the first convex pattern is set such that a phase difference between the electromagnetic wave passing through the first translucent portion and the electromagnetic wave passing through the first concave pattern is 90 degrees.

10. The imprint method according to claim 9, wherein, in a case that a plurality of third marks exists, the receiving a second diffracted light and the calculating a template height are performed for all of the third marks.

11. The imprint method according to claim 9, wherein, in the placing of the second light source and the second light reception sensor, the first light source placed on the first light path is placed on the second light path and is used as the second light source, the first light reception sensor placed on the second light path is placed on the first light path and is used as the second light reception sensor.

12. The imprint method according to claim 11, wherein, in the placing of the second light source and the second light reception sensor, the first light source and the first light reception sensor are switched while a substrate stage that holds the substrate to be processed is stationary.

* * * * *